US 6,614,308 B2

(12) United States Patent
Moller et al.

(10) Patent No.: US 6,614,308 B2
(45) Date of Patent: Sep. 2, 2003

(54) MULTI-STAGE, HIGH FREQUENCY, HIGH POWER SIGNAL AMPLIFIER

(75) Inventors: Thomas W. Moller, Gilroy, CA (US);
Larry Leighton, Scottsdale, AZ (US);
Prasanth Perugupalli, Gilbert, AZ (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/037,638

(22) Filed: Oct. 22, 2001

(65) Prior Publication Data

US 2003/0076173 A1 Apr. 24, 2003

(51) Int. Cl.⁷ .................................................. H03F 3/68
(52) U.S. Cl. ....................................... 330/295; 330/286
(58) Field of Search ............................... 330/65, 66, 67, 330/68, 286, 295, 302

(56) References Cited

U.S. PATENT DOCUMENTS

| | | | | |
|---|---|---|---|---|
| 5,274,341 A | * | 12/1993 | Sekine et al. | 330/295 |
| 5,696,466 A | * | 12/1997 | Li | 330/286 |
| 5,955,926 A | * | 9/1999 | Uda et al. | 330/295 |
| 6,099,677 A | | 8/2000 | Logothetis et al. | |
| 6,201,445 B1 | * | 3/2001 | Morimoto et al. | 330/295 |

* cited by examiner

Primary Examiner—Robert Pascal
Assistant Examiner—Khanh Van Nguyen
(74) Attorney, Agent, or Firm—Baker Botts L.L.P.

(57) ABSTRACT

A broadband RF signal amplifier includes a plurality of transistors attached to a surface of a pedestal, each transistor having an input and an output. An RF input path electrically connected to the transistor inputs includes a passive splitter implemented in a multi-layer printed circuit board and configured to split a RF input signal into a plurality of component input signals. A plurality of corresponding input matching networks including one-quarter wavelength transmission lines implemented in the printed circuit board couple respective component input signals to the transistor inputs at an input impedance, the input matching networks further comprising respective input matching capacitors attached to the pedestal. An RF output path electrically connected to the transistor outputs includes a passive combiner implemented in the printed circuit board and configured to combine component output signals received at the transistor outputs into a RF output signal. A plurality of corresponding output matching networks including one-quarter wavelength transmission lines implemented in the printed circuit board couple the respective component output signals at the transistor outputs to an output impedance.

27 Claims, 7 Drawing Sheets

MULTI-STAGE, HIGH FREQUENCY, HIGH POWER SIGNAL AMPLIFIER

FIELD OF THE INVENTION

The present invention pertains generally to the field of radio frequency (RF) power transistor devices and, more specifically, to high frequency, high power signal amplifiers used in wireless communication applications.

BACKGROUND

The use of RF power transistor devices as signal amplifiers in wireless communication applications is well known. With the recent growth in the demand for wireless services, such as personal communication services, the operating frequency for wireless networks has increased dramatically and is now well into the gigahertz. For example, RF power transistors are commonly used in amplification stages for radio base station amplifiers in wireless communication networks. Such power transistors are also widely used in other RF-related applications, such as cellular telephones, paging systems, navigation systems, television, avionics, and military applications.

Production of RF power transistors on a large-volume basis is traditionally problematic, because of natural variables that the individual transistor elements possess. For example, the transistor devices have natural variances in input capacitance, gain and phase shift. In commercial implementations, significant time and effort is needed to first characterize a particular transistor device over a range of expected operating frequencies and voltages, and then attempt to build further devices using like materials, which deliver similar desired performance. Due to the variations in transistors' and various other elements over identical operating frequencies and voltages, however, the ability to successfully tune transistor devices on a large scale manufacturing basis is limited.

Such problems with large scale manufacturing of power transistor devices and amplifiers in high frequency applications are compounded by ever widening operating power ranges and very broad bandwidths of evolving wireless applications, such as those required in a Third Generation ("3G") wireless network. In particular, input and output impedance matching becomes very difficult over such wide power ranges and high frequencies, and even small variations in device construction can cause instability and failure.

SUMMARY OF INVENTIONS

In accordance with a general aspect, inventions disclosed and described herein are directed to high frequency, high power (hereinafter "broadband") RF signal amplifiers designed and constructed to overcome the above-described problems, and allow for easier large-scale manufacturing and uniform performance.

In one embodiment, the broadband RF amplifier includes a plurality of power transistors attached to a surface of a pedestal, each transistor having an input and an output. A RF input path electrically connected to the respective transistor inputs includes a passive splitter implemented in a multi-layer printed circuit board ("PCB") and configured to split a RF input signal into a plurality of component input signals. A corresponding plurality of input matching networks employing one-quarter wavelength transmission lines implemented in the PCB couple the respective component input signals to the transistor inputs at an input impedance. A RF output path electrically connected to the respective transistor outputs includes a passive combiner implemented in the PCB and configured to combine component output signals at the transistor outputs into a RF output signal. A corresponding plurality of output matching networks employing one-quarter wavelength transmission lines implemented in the PCB couple the respective component output signals at the transistor outputs to an output impedance.

In one embodiment, the PCB has an opening sized to accommodate the pedestal, such that respective input and output reference ground shelves implemented in the PCB are located adjacent a pedestal surface to which the power transistors are attached. Respective sets of bond wires electrically connect the input and output reference ground shelves to the pedestal surface, the input and output reference ground shelves and the pedestal surface positioned sufficiently close that the bond wires provide relatively low inductance transmission paths.

By splitting the RF input signal into individually amplified component, which are then combined, the operating point of each transistor may be relatively low, allowing for the input impedance at each transistor to be relatively high. This, in turn, provides for greater stability through the full operating range of the broadband amplifier, which still providing the requisite performance characteristics. A preferred embodiment of the broadband amplifier is efficiently achieved by implementing the input and output matching and direct current bias networks in a multi-layer PCB module. Transmission lines of the respective matching and bias networks are coupled to power transistors located on a separate pedestal sharing a common reference ground with the PCB.

Other aspects and features of the inventions disclosed herein will become apparent hereinafter.

BRIEF DESCRIPTION OF THE DRAWINGS

The drawings illustrate both the design and utility of preferred embodiments of the disclosed inventions, in which similar elements in different embodiments are referred to by the same reference numbers for ease in illustration, and wherein.

DETAILED DESCRIPTION OF PREFERRED EMBODIMENTS

Figure 1:
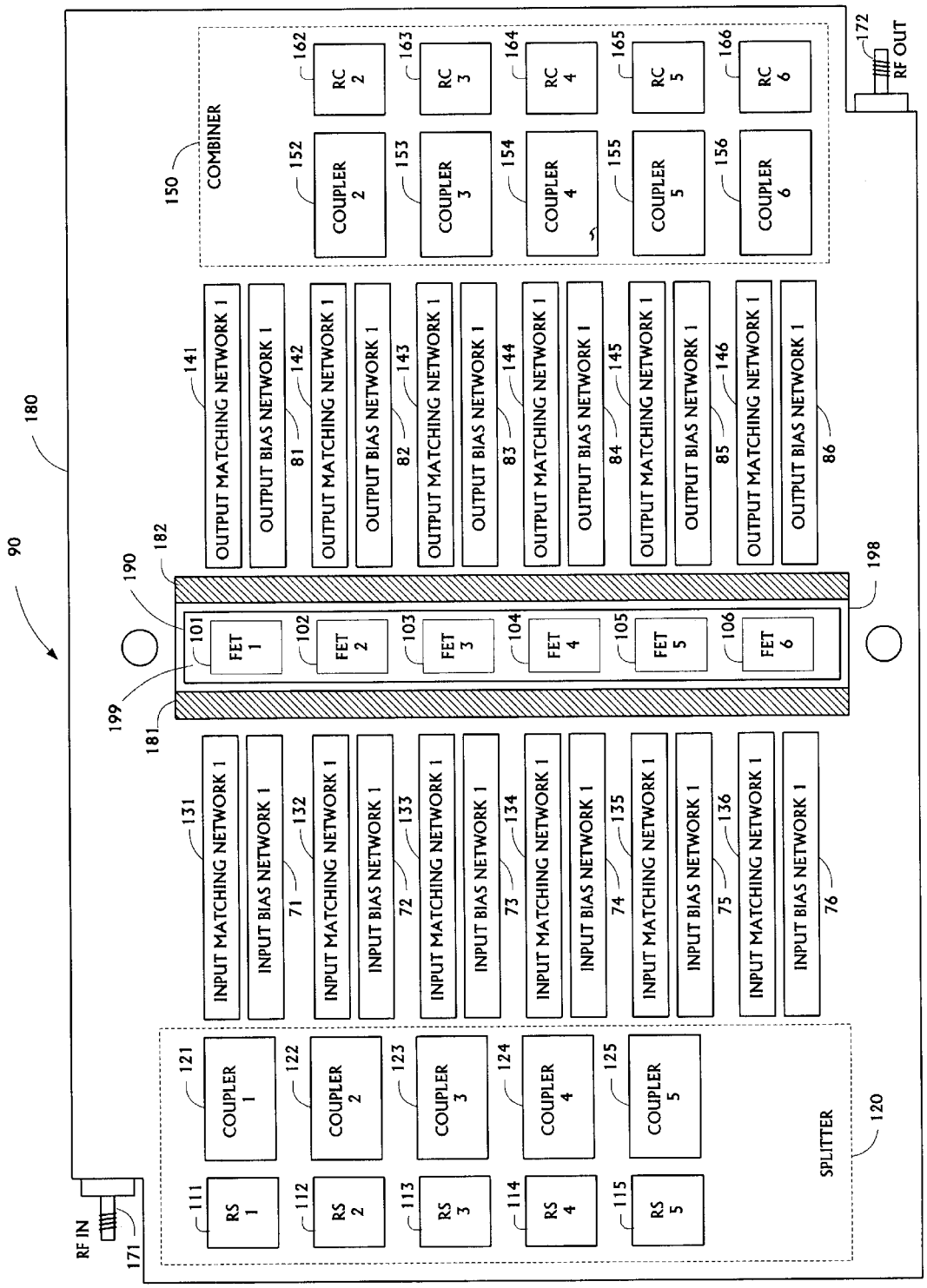
FIG. 1 illustrates a combined functional/physical layout of a broadband amplifier.

FIG. 1 illustrates a combined functional/physical layout of a high frequency, high power ("broadband") broadband amplifier 90 constructed in accordance with one aspect of the invention. The amplifier 90 generally includes a printed circuit board (PCB) 180 and a power transistor pedestal 190. The PCB 180 has as RF power input 171 for receiving a RF input signal, and a RF power output 172 for outputting an amplified RF output signal. The pedestal 190 has a surface 199 with a plurality of power transistor circuits ("power transistors") 101–106 attached thereto. The power transistors 101–106 each amplify a phase component signal of the RF input signal to thereby boost the power level from the RF power input 171 to the RF power output 172.

The pedestal 190 provides support for the circuit components of the respective power transistors 101–106; provides a high electrical conductivity for carrying common currents; and provides high thermal conductivity for cooling. One preferred material for pedestal 190 is copper or a copper alloy with properties optimized for thermal conductivity and electrical conductivity at the operating frequencies of the amplifier 90.

As is described in greater detail herein, the power transistors 101–106 preferably comprise field effect transistors having an input (gate), output (drain) and common element (source) terminal formed on a semiconductor die attached to the pedestal surface 199. In one embodiment, the transistors are preferably laterally diffused metal oxide semiconductor (LDMOS) transistors, with the source terminal is formed on a bottom side of the die, i.e., and directly attached to the pedestal surface 199. Each of power transistor circuits 101–106 further includes one or more input and output matching capacitors (not shown in FIG. 1) attached to the pedestal surface 199.

The PCB 180 is preferably a multi-layer module, such as taught in U.S. Pat. No. 6,099,677 to Logothetis et al., the disclosure of which is fully incorporated herein, and includes components performing several electrical functions. These components including a passive splitter 120, a plurality of input matching (i.e., impedance transforming) networks 131–136, a plurality of input direct current (dc) bias networks 71–76, a passive combiner 150, a plurality of output matching networks 141–146, a plurality of output dc bias networks 81–86, an input grounding shelf 181, and an output grounding shelf 182.

In the illustrated embodiment, the PCB 180 has an opening 198 proximate a mid-point and sized to accommodate the pedestal 190, with a first potion of the PCB 180 adjacent an input side of the pedestal 190 used to implement input path circuitry, and a second portion of the PCB 180 adjacent an output side of the pedestal 190 used to implement output path circuitry. As will be appreciated given the present disclosure, in alternate embodiments, different PCB—pedestal arrangements are possible and contemplated within the scope of the invention.

The splitter 120, which includes couplers 121–125 and termination resistors 111–115, divides a RF input signal received at the RF power input 171 into a plurality of phase component input signals, such that the power driving each power transistor 101–106 is balanced. The splitter 120 divides the RF input signal into six separate component input signals of equal phase. By dividing the RF input signal into respective component input signals, the operating point (at the input) of each power transistor 101–106 is relatively low and, thus, the input impedance relatively high, compared to an amplifier with a single power transistor used to amplify the entire RF input signal. The splitter 120 is implemented in the PCB with micro-strip and strip-line conductors, which are well known in the art. In alternate embodiments, differing splitter configurations and a resulting number of component input signals may be employed.

The input matching networks 131–136 efficiently couple the respective component input signals from the splitter 120 to respective transistor inputs (gates) in the corresponding power transistors 101–106. The input bias networks 71–76 provide a dc gate bias voltage to set the operating point of the respective power transistors 101–106. The input matching and dc bias networks 131–136 and 71–76 are implemented in the input portion of the PCB 180 using micro-strip and strip-line conductors.

The combiner 150, which includes couplers 152–156 and termination resistors 162–166, combines the boosted signals at the respective transistor outputs in the respective power transistors 101–106, in cooperation with the respective output matching networks 141–146. The output matching networks 141–146 provide efficient transfer of RF power from the respective transistor outputs of the power transistors 101–106 to the combiner 150. The output dc bias networks 81–86 provide dc bias power to the respective transistor outputs of the power transistors 101–106. The combiner 150, output matching networks 141–146, and output dc bias networks 81–86, respectively, are implemented in the output path portion of the PCB 180 using micro-strip and stripline conductors.

Figure 2:
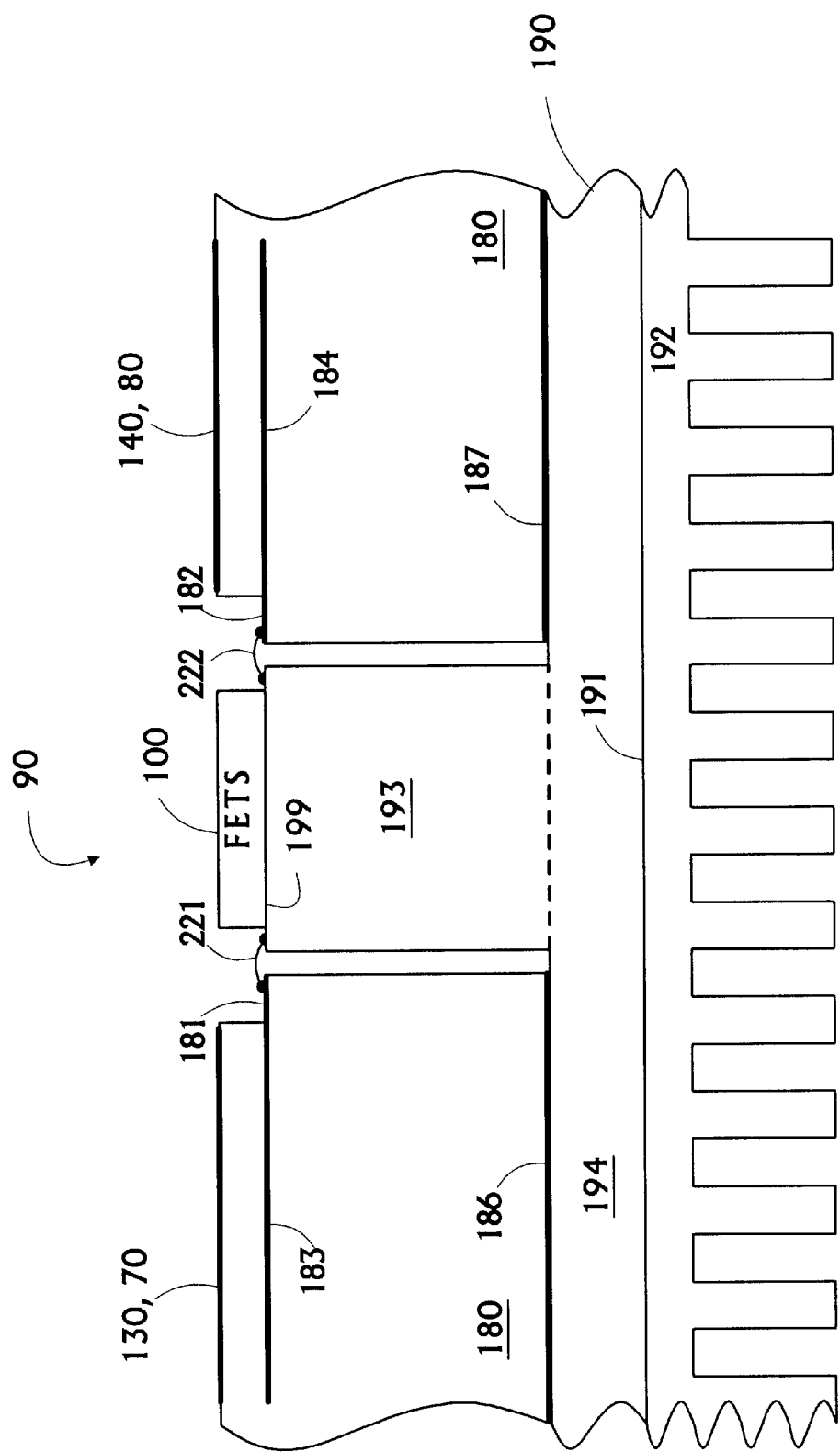
FIG. 2 is a cross section of the amplifier of FIG. 1, shown coupled to a heat sink.

With reference also to FIG. 2, an internal conductive layer 183 within the input path portion of the PCB 180 acts as a reference ground for various transmission lines (described in greater detail herein) in the input matching and input dc bias networks 131–136 and 71–76. An exposed portion of the conductive layer 183 forms an input grounding shelf 181 proximate the pedestal 190, which provides numerous bond pad sites for a plurality of bond wires that electrically connect the input reference ground (conductive layer 183) to the pedestal 190.

Similarly, a conductive layer 184 in the output path portion of the PCB 180 acts as a reference ground for various transmission lines (described in greater detail herein) in the output matching and output dc bias networks 141–146 and 81–86. An exposed portion of the conductive layer 184 forms an output grounding shelf 182 proximate the pedestal 190, which provides numerous bond pad sites for a plurality of bond wires that electrically connect the output reference ground (conductive layer 184) to the pedestal 190. Notably, the input reference ground (conductive layer 183) may be electrically coupled to the output reference ground (conductive layer 184), and in fact may be the same conductive layer in the PCB 180.

As seen in FIG. 2, the pedestal 190 generally comprises a raised flange portion 193 extending from a spreader portion 194. As indicated by dashed line 196, the raised flange and spreader portions 193 and 194 may be a single, i.e., integral piece, or may be comprised of two or more attached pieces. The spreader portion 194 is thermally coupled to a heat sink 192 at a thermal interface 191 for efficient transfer of heat from the respective power transistors 101–106 to the environment. Although the heat sink 192 is depicted as a finned device, it is possible the transfer heat to the environment by numerous other means, as is well known in the art.

The pedestal 190 provides a common support structure and common reference ground for both the PCB 180 and the power transistors 101–106 (designated as generic power transistor 100 in FIG. 2). Electrical conduction of common currents flow from the transistors through the flange portion 193, and through conductive pathways (not shown) in the PCB 180 to bottom conductive layers 186 and 187, and into the spreader portion 194. The conductive layers 186 and 187 preferably comprise a metal foil or copper strip, and are preferably in solid electrical contact with the spreader portion 194 of the pedestal 190.

The input grounding shelf 181 is disposed in the vicinity of the input matching networks 131–136 and input dc bias networks 71–76 (designated as generic input matching network 130 and bias network 70 in FIG. 2) in the input path portion of the PCB 180. The PCB 180 and pedestal 190 are preferably positioned with respect to each other so that the input grounding shelf 181 is approximately coplanar with the mounting surface 199 of the pedestal 190. The shelf 181 has metalization exposed from the input path ground plane (i.e., conductive layer 183) for attaching the plurality of input grounding shelf bond wires 221 to the pedestal surface 199. The input grounding shelf 181 and pedestal surface 199 are preferably sufficiently close that the bond wires 221 provide a low inductance path between the input path ground plane (conductive layer 183) and the pedestal 190.

Similarly, the output grounding shelf 181 is disposed in the vicinity of the output matching networks 141–146 and output dc bias networks 81–86 (designated as generic output matching network 140 and bias network 80 in FIG. 2) in the output path portion of the PCB 180. The PCB 180 and pedestal 190 are preferably positioned with respect to each other so that the output grounding shelf 182 is approximately coplanar with the mounting surface 199 of the pedestal 190. The shelf 182 has metalization exposed from the input path ground plane (i.e., conductive layer 184) for attaching the plurality of output grounding shelf bond wires 222 to the pedestal surface 199. The output grounding shelf 182 and pedestal surface 199 are preferably sufficiently close that the bond wires 222 provide a low inductance path between the output path ground plane (conductive layer 184).and the pedestal 190.

Figure 3:
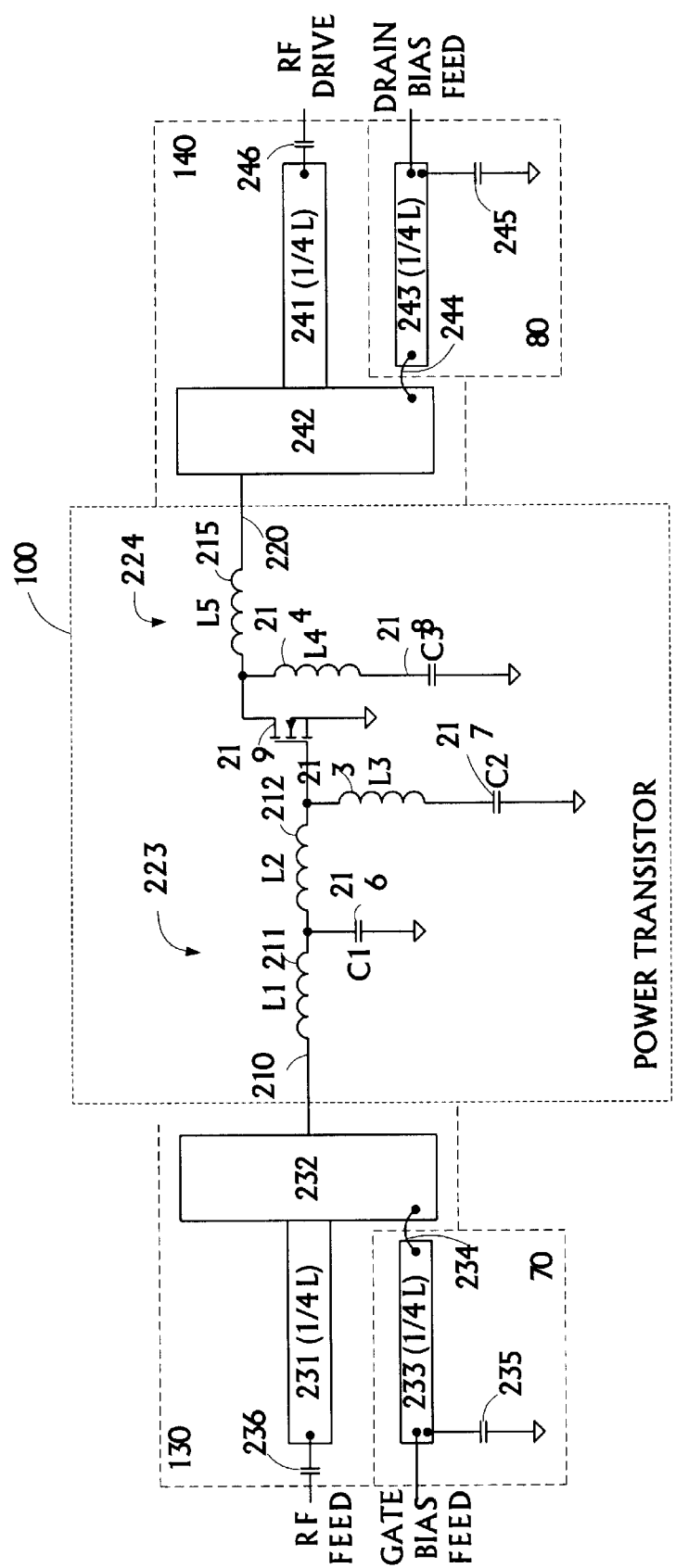
FIG. 3 is a schematic illustration of a generic amplifier section of the amplifier of FIG. 1.

FIG. 3 is a schematic of a generic "amplifier section" of the amplifier 90, which, for purposes of discussion herein includes a respective input matching network 130, gate bias network 70, power transistor 100, output matching network 140 and drain bias network 80. For example, by this convention, the first amplifier section includes input matching network 131, gate bias network 71, power transistor 101, output matching network 141 and drain bias network 81. While the illustrated amplifier 90 is implemented with six amplifier sections, one skilled in the art will appreciate that an alternate embodiment may be implemented with two or more amplifier sections in accordance with the inventive aspects taught and described herein.

In the amplifier section of FIG. 3, the input matching network 130 receives RF power in the form of a component input signal from a corresponding output of splitter 120 (designated as "RF FEED") to stimulate the gate of a respective transistor device 219 in power transistor 100. The gate bias network 70 receives a dc bias voltage from an input bias source (designated as "GATE BIAS FEED") which is used to set the operating point for the transistor device 219. The power transistor 100 receives RF power (i.e., the respective component input signal) from the input matching network 130, and the dc bias from the gate bias network 70, and produces a high power RF output component signal that drives the output matching network 140. The corresponding input to combiner 150 (designated as "RF DRIVE") receives the high power output component signal from the output matching network 140. The source of power for the high power output component signal is supplied from the drain bias network 80 (designated as "DRAIN BIAS FEED").

The input matching network 130 includes input blocking capacitor 236, first input transmission line 231, and second input transmission line 232. The Input blocking capacitor 236 prevents dc voltage from the gate bias network from entering the splitter 120. It also prevents stray sources of dc voltage from entering the gate. First input transmission line 231 cooperates with second input transmission line 232 to provide efficient coupling of RF power from the splitter 120 to the power transistor input 210 by matching source and load impedance. The source impedance of the splitter 120 is preferably 50 ohms. To get efficient coupling of this source of RF power into first input transmission line 231, the impedance looking into line 231 must also be 50 ohms.

Second input transmission line 232 is preferably 6.25 ohms for coupling to the power amplifier input 210, and therefore presents a load impedance of 6.25 ohms. Transmission line theory predicts that a loss-less impedance transformation takes place with a one-quarter wavelength transmission line. If the impedance of the transmission line is Z0, the load impedance is ZL and the source impedance is ZS, then Z0=SQRT( ZL*ZS), where SQRT denotes a square root operation. Using the preferred values for ZL (50 ohms) and ZS (6.25 ohms), computation makes the value of Z0 equal to 17.7 ohms. Therefore, first input transmission line 231 is formed to be 17.7 ohms and one-quarter wavelength at the operating frequency of the amplifier, and performs the impedance transformation from 50 ohms to 6.25 ohms.

The gate bias network includes gate bias de-coupling capacitor 235, gate bias transmission line 233, and gate bias bond wire(s) 234. A source of DC voltage provides the gate bias feed and drives capacitor 235. Bond wire(s) 234 couple line 233 into the circuit providing a DC bias voltage to the gate of device 219.

Transmission line theory predicts that the input impedance of a one-quarter wavelength transmission line terminated with a short circuit is an open circuit. As a practical matter, a one-quarter wavelength transmission line terminated with a relatively low impedance presents a high impedance to the source. De-coupling capacitor 235 in parallel with the DC source providing the gate bias feed present a very low impedance at the end of line 233 where they are coupled. The impedance looking into line 233 at the end coupled to bond wire(s) 234 is a relatively high impedance, approaching an open circuit. This prevents RF power directed toward the gate from leaking into the gate bias network, and provides a method of coupling a dc voltage to the active device, without disturbing the impedance matching structures.

The power transistor 100 includes a RF power transistor device 219, in a common source configuration, which is coupled to the pedestal 190. The power transistor 100 has an input 210, an output 220, a gate tuning network 223, and a drain tuning network 224. The power transistor input 210 receives RF input power from the input matching network 130 to stimulate the power transistor 100. RF output power developed by the power transistor 100 is delivered to the output matching network 140 at the power transistor output 220.

The bond wires used to connect the power transistor 100 to external nodes on the PCB 180, and to interconnect the components of the power transistor 100 located on the pedestal 190, have self-inductance that cannot be neglected at typical frequencies of operation. Several impedance transformations and tuning networks are required to effectively couple RF power coming from the splitter 120 to the gate of the transistor device 219. Similar impedance transformations and tuning networks are also s required to effectively couple RF power coming from the drain of the transistor device 219 to the combiner 150.

Towards this end, a gate tuning network 223 provides compensation for the bond wire inductors, as well as the input capacitance associated with the gate of transistor device 219. The gate tuning network 223 includes a "T-network," and a "shunt network." The T-network includes a first bond wire inductance 211 coupled to the power transistor input 210, a second bond wire inductance 212 coupled to the gate of the transistor device 219, and a first input matching capacitor 216 coupled to ground on the pedestal 190, each coupled to a central node. The T network transforms the impedance "looking" into the transistor input terminal at the fundamental frequency into the 6.25 ohms.

The shunt network includes a third bond wire inductance 213 coupled to a blocking capacitance 217, which prevents the inductance 213 from shorting the transistor gate to ground. Because capacitance 217 must have a value, it is part of the input matching network 130, and is referred to herein as a second input matching capacitor. The third bond wire inductance 213 is coupled to the gate of transistor device 219, and the second input capacitor 217 is coupled to ground on the pedestal 190. The shunt network provides resonance at the fundamental signal frequency, while negating gate impedance.

A drain tuning network 224 provides compensation for the bond wire inductors, as well as the capacitance associated with the drain of transistor device 219. The drain tuning network 224 includes a shunt network and a series inductance. The series inductance is the result of a fifth bond wire 215 connecting the drain of device 219 to the output matching network 140. The shunt network includes a fourth bond wire inductance 214 coupled to an output matching capacitor 218. The fourth bond wire inductance 214 is coupled to the drain of transistor device 219, and the output matching capacitor 218, which is part of the output matching network 140, is coupled to ground on the pedestal 190. These components provide broadband matching at a certain load impedance, to provide a desired power level for optimum amplifier efficiency.

The output matching network 140 includes first output transmission line 241, second output transmission line 242, and output blocking capacitor 246. Output matching network 140 functions in essentially the same way as the input matching network 130, but with the functions applied in reverse order. The impedance of the first output transmission line 242 is preferably 6.25 ohms for coupling to the power amplifier output 220, and therefore presents a load impedance of 6.25 ohms to the transistor output terminal.

Second output transmission line 241 cooperates with first transmission line 242 to provide efficient coupling of RF power from the power amplifier output 220 to the corresponding input to the combiner 150, by matching source and load impedance. The load impedance looking into the combiner 150 is preferably 50 ohms. The source impedance of line 242 is preferably 6.25 ohms. In order to get efficient coupling of this source of RF power into the second output transmission line 241, the impedance looking into line 241 must also be 6.25 ohms.

Using the equation for loss less impedance transformation of a one-quarter wavelength transmission line with preferred values for ZS (6.25 ohms) and ZL (50 s ohms) yields a transmission line impedance Z0 of 17.7 ohms. Therefore, first transmission line 241 is formed to be 17.7 ohms and one-quarter wavelength at the operating frequency of the amplifier, and performs the impedance transformation from 50 ohms to 6.25 ohms. The output blocking capacitor 246 prevents DC voltage from the drain bias network from entering the combiner 150. It also prevents stray sources of DC voltage from entering the drain circuits.

The drain bias network 80 includes drain bias de-coupling capacitor 245, drain bias transmission line 243, and drain bias bond wire(s) 244. A source of DC voltage provides the drain bias feed and drives capacitor 245. Bond wire(s) 244 couple line 243 into the circuit providing a DC voltage to the drain of device 219. Similar to the gate bias network 70, the drain bias transmission line 243 is a one-quarter wavelength line. Drain de-coupling capacitor 245 in parallel with the DC source providing the drain bias feed present a very low impedance at the end of line 243 where they are coupled. The impedance looking into line 243 at the end coupled to bond wire 244 is a very high impedance, approaching an open circuit. This prevents RF power directed toward the drain from leaking into the drain bias network and localizes the RF signal. Although the power amplifier 100 illustrated is implemented with nominal component values, the skilled practitioner will appreciate that the values of components 211 through 219 may be adjusted in order to achieve tuning for optimal performance from the amplifier 100.

Figure 4:
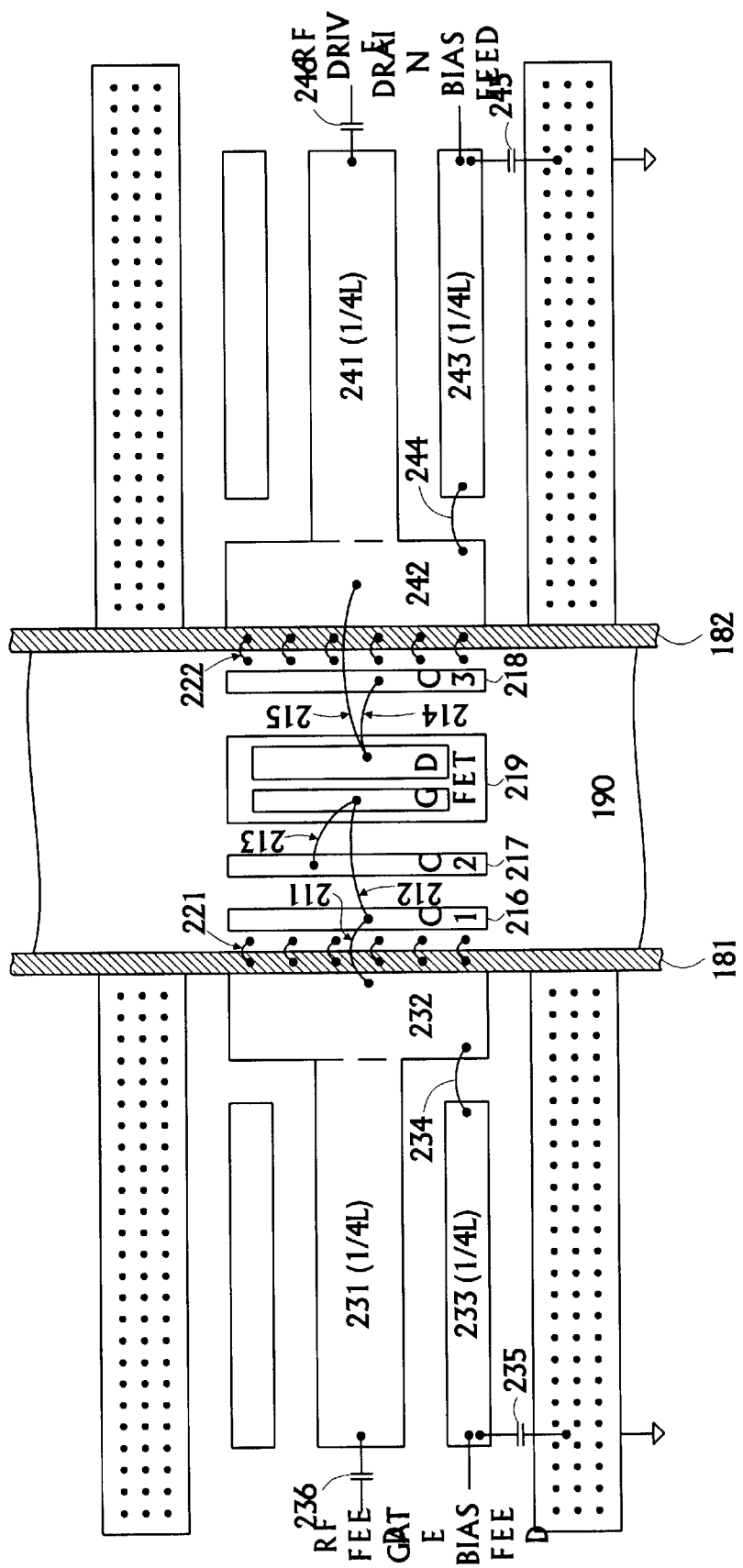
FIG. 4 is a top view providing a more detailed illustration of the physical layout and bond wire connections of the amplifier section of FIG. 3.

FIG. 4 is a top view providing a more detailed illustration of the physical layout and bond wire connections 211, 212, 213, 214, 215, 221 and 222 of the amplifier section of FIG. 3. Although the bond wires 211, 212, 213, 214, 215 are depicted as single conductors of minimum length, a skilled practitioner will appreciate that each conduction path may be formed with one or more bond wires. Selecting the number of bond wires applied in parallel, and the length of the bond wires, allows the inductance of the conduction path to be controlled and adjusted to convenient values.

Figure 5:
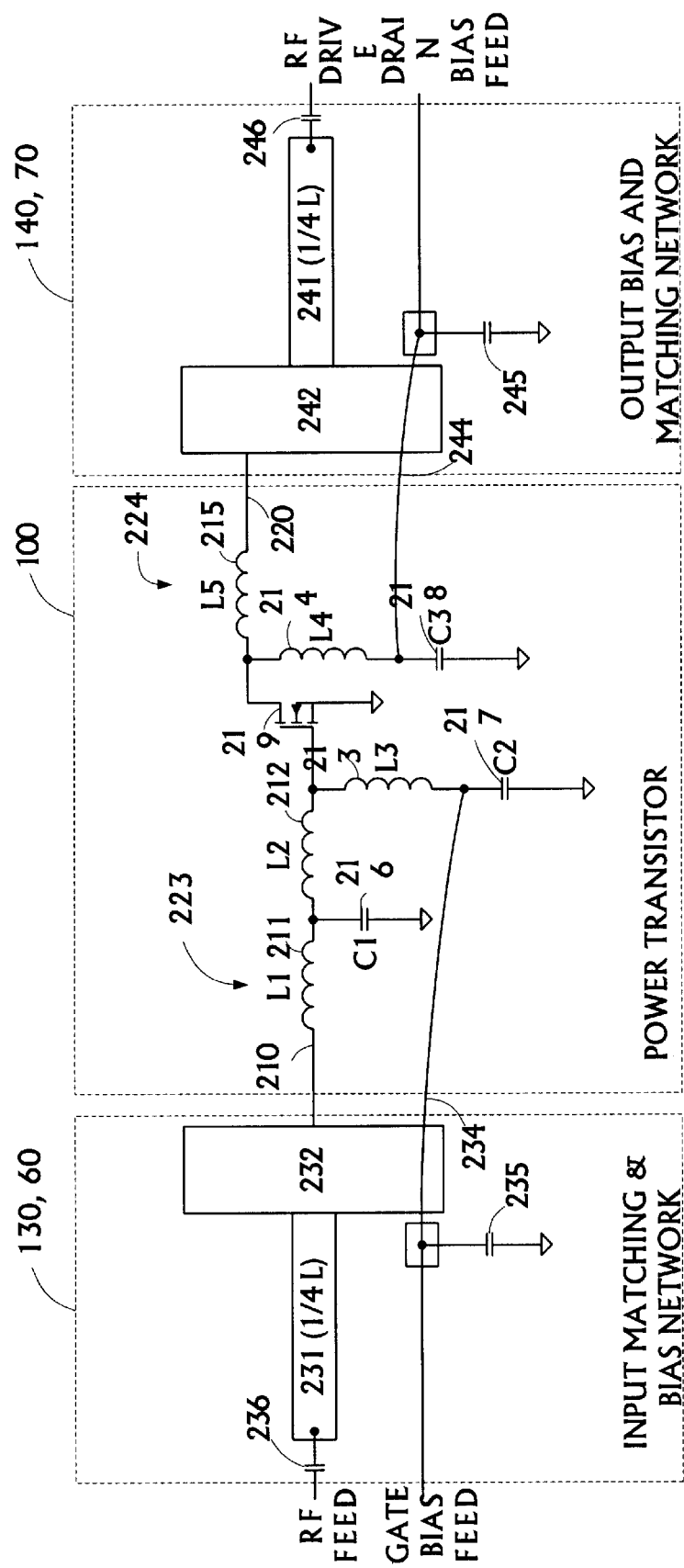
FIG. 5 is a schematic illustration of an alternate generic amplifier section.

FIG. 5 is a schematic of an alternate generic amplifier section 100 with alternate gate biasing and drain biasing network implementation. In this embodiment, the gate bias bond wires 234 connect directly to the input shunt network, rather than the second input transmission line 232, so that the gate bias voltage is injected at the junction of inductor 213 and capacitor 217. Similarly, the drain bias bond wires 244 connect directly to the output shunt network, rather than the first output transmission line 242. The drain bias voltage is injected at the junction of inductor 214 and capacitor 218 in this alternate embodiment. One advantage of the alternate gate and drain biasing networks shown in FIG. 5 is that, by directly coupling the gate and drain bias voltages to the respective input and output shunt capacitors, the one-quarter wavelength transmission lines may be eliminated in the respective networks, thus, saving significant space in the PCB 180.

Figure 6:
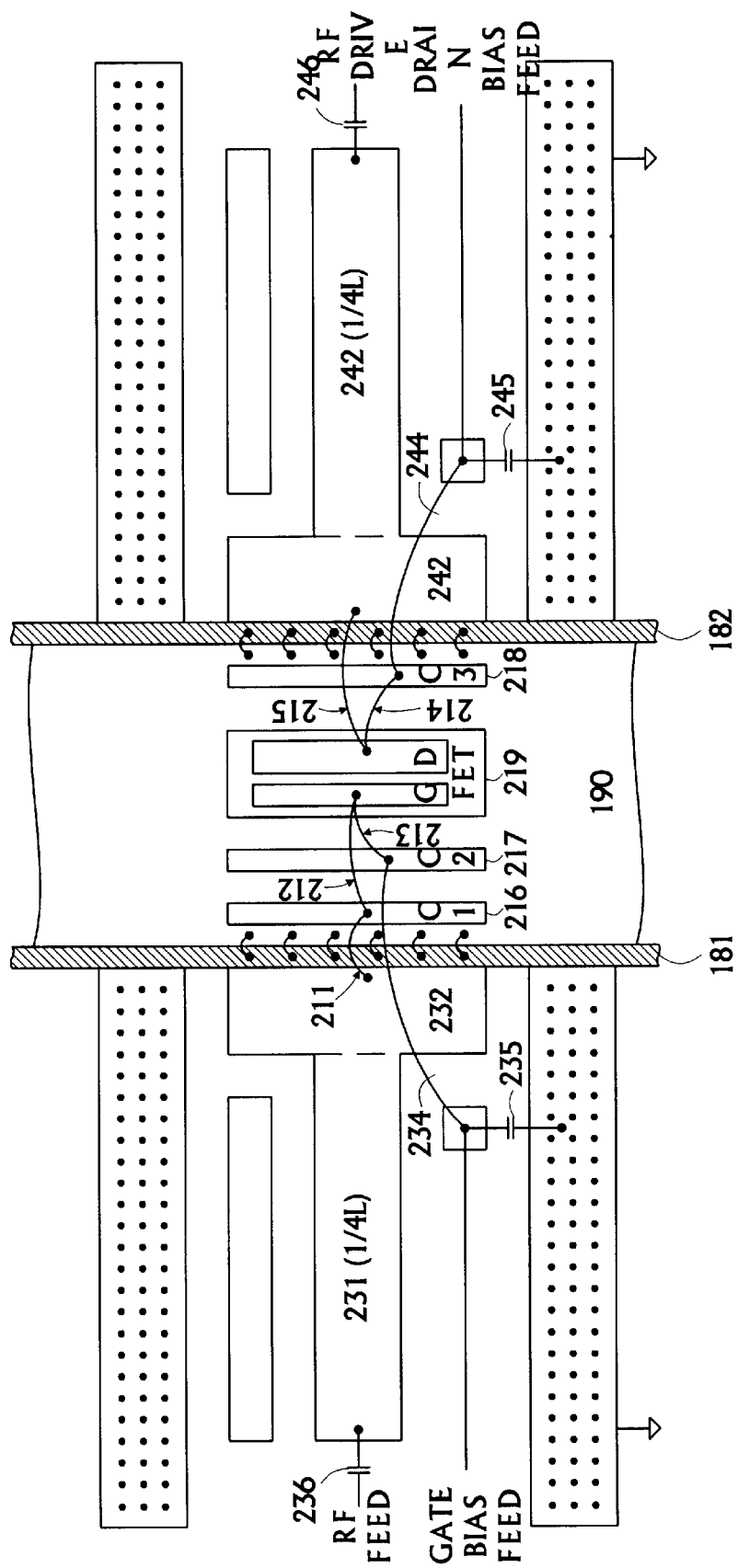
FIG. 6 is a top view providing a more detailed illustration of the physical layout and bond wire connections of the amplifier section of FIG. 5.

FIG. 6 is a top view providing a more detailed illustration of the physical layout and bond wire connections 211, 212, 213, 214, 215, 221 and 222 of the amplifier section of FIG. 5. Again, while the bond wires 211, 212, 213, 214, 215 are depicted as single conductors of minimum length, a skilled practitioner will appreciate that each conduction path may be formed with one or more bond wires. Selecting the number of bond wires applied in parallel, and the length of the bond wires, allows the self-inductance of the conduction path to be controlled and adjusted to convenient values.

Figure 7:
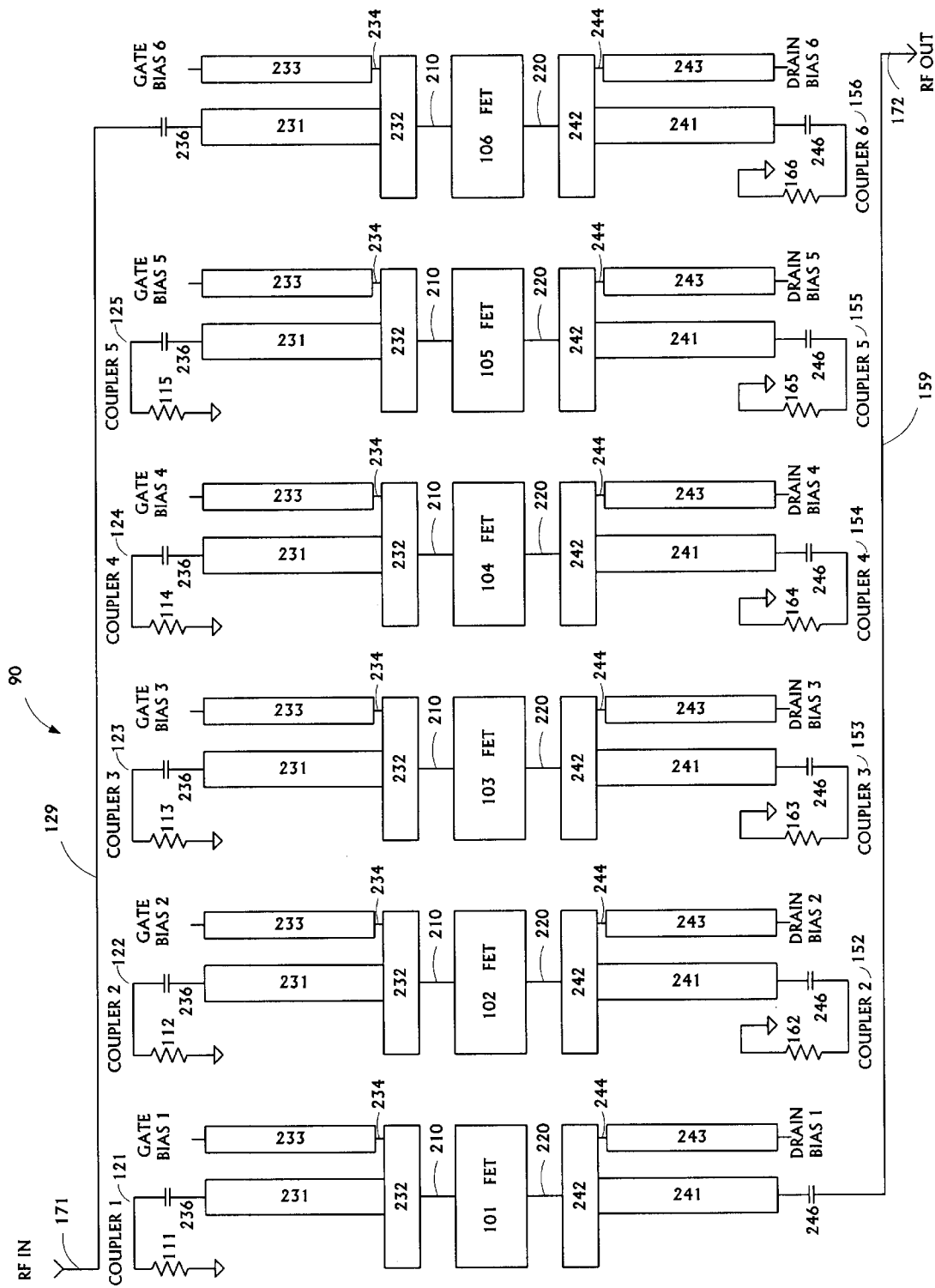
FIG. 7 is a physical/functional schematic illustration of the amplifier of FIG. 1.

FIG. 7 is a physical/functional schematic illustration of the amplifier 90, depicting s the plurality of amplifier sections operating in parallel. Each power transistor 101–106 has a respective input matching network 131–136, gate bias network 71–76, output matching network 141–146, and drain bias network 81–86. Each input matching network 131–136 includes an input blocking capacitor 236, first input transmission line 231, and second input transmission line 232. The gate bias networks each include a gate bias de-coupling capacitor 235, gate bias transmission line 233, and gate bias bond wire 234. The output matching networks include a first output transmission line 241, second output transmission line 242, and output blocking capacitor 246. The drain bias network includes drain bias de-coupling capacitor 245, drain bias transmission line 243, and drain bias bond wire 244.

The amplifier sections cooperate in parallel to boost the power level from the RF power input 171 to the RF power output 172. Input power coming from RF input 171 is divided by the splitter into approximately equal phase component input signals supplied to the respective amplifier sections. Each amplifier section has power gain and provides added RF drive. The RF drive from each amplifier section is combined to provide RF output 172, which is a sum of the contribution from each amplifier section.

The splitter 120, which includes couplers 121–125, splitter input transmission line 129 and termination resistors 111–115, divides the RF input power approximately equally among the power transistors 101–106. As RF input power passes along splitter transmission line 129, the couplers 121–125 divert approximately equal portions of the input power to the corresponding amplifier section. Note that no coupler is necessary for the final amplifier section at the end of the transmission line 129, at which point ⅚ths of the power entering at RF input 171 has been tapped off, leaving $\frac{1}{6}^{th}$ of the power to directly drive the last amplifier section.

RF power entering an amplifier section through blocking capacitor 236 is boosted by the amplifier section producing increased RF power that exits through output blocking capacitor 246. The RF drive from each amplifier section is combined by the combiner 150, which operates in essentially the same way as the splitter 120, but in reverse. RF output power from each amplifier section passes into combiner transmission line 159. Couplers 152–156 inject approximately equal portions of output power from each corresponding amplifier section. Again, no coupler is necessary for first amplifier section at the input end of the transmission line 159, with the power transistor 101 contributing $\frac{1}{6}^{th}$ of the total output power. Couplers 152–156 inject the remaining ⅚ths of the total output power, which is delivered to RF output 172.

Although particular embodiments of the invention have been shown and described, the invention is not limited to the preferred embodiments and it will be apparent to those killed in the art that various changes and modifications may be made without departing from the scope of the invention, which is defined only by the appended claims and their equivalents.

What is claimed:

1. A broadband radio frequency (RF) signal amplifier, comprising:
   a plurality of transistors attached to a surface of a pedestal, each transistor having an input and an output, the pedestal comprising a support structure, reference ground and heat sink for the transistors;
   a RF input path electrically connected to the transistor inputs, the input path including a splitter configured to split a RF input signal into a plurality of component input signals, a plurality of input matching networks, each input matching network configured to couple a respective component input signal to a respective transistor input at an input impedance, and a plurality of input direct current (dc) bias networks, each input dc bias network configured to bias a respective transistor input to an input operating point, the splitter, input matching networks and input bias networks at least partially implemented in a multi-layer printed circuit board; and
   a RF output path electrically connected to the transistor outputs, the output path including a combiner configured to combine component output signals received at the transistor outputs into a RF output signal, a plurality of output matching networks, each output matching network configured to couple a respective component output signal to a respective transistor output at an output impedance, and a plurality of output dc bias networks, each output dc bias network configured to bias a respective transistor output to an output operating point, the combiner, output matching networks and output bias networks at least partially implemented in the printed circuit board;
   wherein the pedestal is configured such that when it is positioned with respect to the printed circuit board, an input or output grounding shelf of the printed circuit board is in close proximity with a mounting surface of the pedestal.

2. The amplifier of claim 1, the printed circuit board having an opening sized to accommodate the pedestal.

3. The amplifier of claim 1, the input and output paths comprising respective input and output reference ground shelves implemented in the printed circuit board, the pedestal and printed circuit board arranged such that the input and output reference ground shelves are adjacent the pedestal surface.

4. The amplifier of claim 3, further comprising respective conductors electrically connecting the input and output reference ground shelves to the pedestal surface.

5. The amplifier of claim 4, the conductors comprising respective sets of bond wires, the printed circuit board and pedestal located sufficiently close such that the bond wires provide relatively low inductance transmission paths.

6. The amplifier of claim 1, the input matching networks comprising transmission lines implemented in the printed circuit board and electrically connecting the component input signals to respective transistor inputs, the transmission lines having lengths approximating one-fourth of a wavelength of a fundamental frequency of the RF input signal.

7. The amplifier of claim 1, the output matching networks comprising transmission lines implemented in the printed circuit board and electrically connecting component output signals to the combiner, the transmission lines having lengths approximating one-fourth of a wavelength of a fundamental frequency of the RF input signal.

8. The amplifier of claim 1, the input matching networks comprising respective input matching capacitors attached to the pedestal, the respective input bias networks electrically connecting an input dc bias source to a respective input matching capacitor, the output matching networks comprising respective output matching capacitors attached to the pedestal, the respective output bias networks electrically connecting an output dc bias source to a respective output matching capacitor.

9. The amplifier of claim 8, wherein the input dc bias source is connected to the input matching capacitors via respective input transmission lines implemented in the printed circuit board, and wherein the output dc bias source is connected to the output matching capacitors via respective output transmission lines implemented in the printed circuit board, the respective input and output transmission lines each having a length approximating one-fourth of a wavelength of a fundamental frequency of the RF input signal.

10. The amplifier of claim 8, wherein the input dc bias source is connected to the input matching capacitors, and the output dc bias source is connected to the output matching capacitors, without the either of input or output dc bias source being transmitted via a transmission line having a length approximating one-fourth of a wavelength of a fundamental frequency of the RF input signal.

11. The amplifier of claim 1, wherein the splitter and combiner are passive elements.

12. The amplifier of claim 1, wherein the input impedance is relatively high, and the input operating point is relatively low.

13. The amplifier of claim 1, further comprising
    a first plurality of conductors electrically connecting respective input path transmission lines implemented in the printed circuit board to respective transistor inputs, and
    a second plurality of conductors electrically connecting respective output path transmission lines implemented in the printed circuit board to respective transistor outputs.

14. The amplifier of claim 12, wherein the first and second pluralities of conductors comprise respective sets of bond wires extending between the printed circuit board and the pedestal.

15. The amplifier of claim 1, wherein the pedestal and printed circuit board are attached to a common reference ground and heat sink.

16. The amplifier of claim 15, the input and output paths comprising respective input and output reference ground shelves implemented in the printed circuit board, the input and output ground shelves electrically connected to the pedestal by respective pluralities of bond wires providing low inductance paths.

17. A broadband radio frequency (RF) signal amplifier, comprising:
    a plurality of transistors attached to a surface of a pedestal, each transistor having an input and an output, the pedestal comprising a support structure, reference ground and heat sink for the transistors;
    a RF input path electrically connected to the transistor inputs, the input path including a splitter configured to split a RF input signal into a plurality of component input signals, a plurality of input matching networks, each input matching network configured to couple a respective component input signal to a respective transistor input at an input impedance, and a plurality of input direct current (dc) bias networks, each input dc bias network configured to bias a respective transistor input to an input operating point, the splitter, input matching networks and input bias networks at least partially implemented in a multi-layer printed circuit board, the input matching networks comprising respective input matching capacitors attached to the pedestal; and
    a RF output path electrically connected to the transistor outputs, the output path including a combiner configured to combine component output signals at the transistor outputs into a RF output signal, a plurality of output matching networks, each output matching network configured to couple a respective component output signal to a respective transistor output at an output impedance, and a plurality of output dc bias networks, each output dc bias network configured to bias a respective transistor output to an output operating point, the combiner, output matching networks and output bias networks at least partially implemented in the printed circuit board, the output matching networks comprising respective output matching capacitors attached to the pedestal;
    wherein the pedestal is configured such that when it is positioned with respect to the printed circuit board, an input or output grounding shelf of the printed circuit board is in close proximity with a mounting surface of the pedestal.

18. The amplifier of claim 17, the input dc bias networks electrically connecting an input dc bias source to respective input matching capacitors, and the output dc bias networks electrically connecting an output dc bias source to respective output matching capacitors, without the either of input or output dc bias source being transmitted via a transmission line having a length approximating one-fourth of a wavelength of a fundamental frequency of the RF input signal.

19. The amplifier of claim 17, the printed circuit board having an opening sized to accommodate the pedestal.

20. The amplifier of claim 17, the input and output paths comprising respective input and output reference ground shelves implemented in the printed circuit board, the pedestal and printed circuit board arranged such that the input and output reference ground shelves are adjacent the pedestal surface.

21. The amplifier of claim 20, further comprising respective bond wire conductors electrically connecting the input and output reference ground shelves to the pedestal surface, the input and output reference ground shelves and the pedestal surface sufficiently close such that the bond wires provide relatively low inductance transmission paths.

22. A broadband radio frequency (RF) signal amplifier, comprising:
    a plurality of transistors attached to a surface of a pedestal, each transistor having an input and an output;
    a RF input path electrically connected to the transistor inputs, the input path including a splitter configured to split a RF input signal into a plurality of component input signals, and a plurality of input matching networks, each input matching network configured to couple a respective component input signal to a respective transistor input at an input impedance, the splitter and input matching networks at least partially implemented in a multi-layer printed circuit board, the input matching networks comprising respective input matching capacitors attached to the pedestal; and
    a RF output path electrically connected to the transistor outputs, the output path including a combiner configured to combine component output signals at the transistor outputs into a RF output signal, and a plurality of output matching networks, each output matching network configured to couple a respective component output signal to a respective transistor output at an output impedance, the combiner and output matching networks at least partially implemented in the printed circuit board, the output matching networks comprising respective output matching capacitors attached to the pedestal;
    wherein the pedestal is configured such that when it is positioned with respect to the printed circuit board, an input or output grounding shelf of the printed circuit board is in close proximity with a mounting surface of the pedestal.

23. The amplifier of claim 22, the printed circuit board having an opening sized to accommodate the pedestal.

24. The amplifier of claim 22, the input and output paths comprising respective input and output reference ground shelves implemented in the printed circuit board, the pedestal and printed circuit board arranged such that the input and output reference ground shelves are adjacent the pedestal surface, wherein respective bond wire conductors electrically connect the input and output reference ground shelves to the pedestal surface, the input and output reference ground shelves and the pedestal surface sufficiently close such that the bond wires provide relatively low inductance transmission paths.

25. The amplifier of claim 22, wherein the input path further comprises a plurality of input bias networks electrically connecting an input direct current (dc) bias source to the input matching capacitors, and the output path further comprises a plurality of input bias networks electrically connecting an output dc bias source to the output matching capacitors.

26. The amplifier of claim 25, wherein the input dc bias source is connected to the input matching capacitors through respective transmission lines implemented in the printed circuit board, each having a length approximating one-fourth of a wavelength of a fundamental frequency of the RF input signal, and the output dc bias source is connected to the output matching capacitors through respective transmission lines implemented in the printed circuit board, each having a length approximating one-fourth of a wavelength of a fundamental frequency of the RF input signal.

27. The amplifier of claim 25, wherein the input dc bias source is connected to the input matching capacitors, and the output dc bias source is connected to the output matching capacitors, without the either of input or output dc bias source being transmitted through a one-fourth wavelength transmission line.

* * * * *